US012799952B2

(12) United States Patent
Sauer et al.

(10) Patent No.: US 12,799,952 B2
(45) Date of Patent: Nov. 17, 2026

(54) STIFFENING DEVICE

(71) Applicant: ebm-papst Mulfingen GmbH & Co. KGaA & Co. KG, Mulfingen (DE)

(72) Inventors: Thomas Sauer, Bad Mergentheim (DE); Tomas Smetana, Herzogenaurach (DE)

(73) Assignee: EBM-PAPST MULFINGEN GMBH & CO. KGAA & CO., Mulfingen (DE)

( * ) Notice: Subject to any disclaimer, the term of this patent is extended or adjusted under 35 U.S.C. 154(b) by 0 days.

(21) Appl. No.: 19/333,682

(22) Filed: Sep. 19, 2025

(65) Prior Publication Data

US 2026/0078777 A1 Mar. 19, 2026

(30) Foreign Application Priority Data

Sep. 19, 2024 (DE) ..................... 10 2024 127 092.6

(51) Int. Cl.

| | |
|---|---|
| ***F04D 29/66*** | (2006.01) |
| ***F04D 25/16*** | (2006.01) |
| ***F04D 29/52*** | (2006.01) |
| ***F16B 7/06*** | (2006.01) |
| ***H05K 7/20*** | (2006.01) |

(52) U.S. Cl.

CPC ......... *F04D 29/668* (2013.01); *F04D 25/166* (2013.01); *F04D 29/522* (2013.01); *F16B 7/06* (2013.01); *H05K 7/20172* (2013.01); *F24F 2221/36* (2013.01)

(58) Field of Classification Search

CPC ...... F04D 13/14; F04D 25/166; F04D 29/522; F04D 29/668; H05K 7/20127–20172; F16B 7/06; F24F 2221/36

See application file for complete search history.

(56) References Cited

U.S. PATENT DOCUMENTS 7,556,448 B2 * 7/2009 Hu ............................ F16B 7/06 403/44
8,960,451 B2 * 2/2015 Florence, Jr. ........ H05K 7/1488 211/26

(Continued)

FOREIGN PATENT DOCUMENTS

CN 106640711 A 5/2017
CN 211715395 U 10/2020

(Continued)

OTHER PUBLICATIONS

Technical drawing for Hook/Hook Turnbuckle stock # N222-034, National Hardware, Mar. 2020 (Year: 2020).*
European Search Report for EP25198520.6 dated Feb. 3, 2026.

*Primary Examiner* — Christopher R Legendre
(74) *Attorney, Agent, or Firm* — Dickinson Wright PLLC

(57) ABSTRACT

A stiffening device for stiffening fans that are arranged in parallel. The device has a base body with a first fastening element for fastening to a receiving structure of one of the fans being formed on or as part of the base body. A second fastening element is formed as part of the base body for fastening to a receiving structure of another fan arranged particularly immediately adjacent the one fan. The base body has a tolerance compensation device for adjusting, particularly continuously, a longitudinal extent of the stiffening device such that, in an assembled state, a stiffness of the fans connected by the stiffening device can be increased.

10 Claims, 3 Drawing Sheets

(56) References Cited

U.S. PATENT DOCUMENTS

| | | | | |
|---|---|---|---|---|
| 9,874,229 | B2 * | 1/2018 | Chen | F04D 29/668 |
| 2021/0131450 | A1 * | 5/2021 | Yang | H05K 7/14 |
| 2026/0078777 | A1 * | 3/2026 | Sauer | F04D 29/668 |

FOREIGN PATENT DOCUMENTS

| | | | |
|---|---|---|---|
| CN | 214533728 | U | 10/2021 |
| DE | 102008037146 | A1 | 4/2009 |

* cited by examiner

STIFFENING DEVICE

RELATED APPLICATIONS

This application claims priority to German Patent Application No. 10 2024 127 092.6, filed Sep. 19, 2024, the entire contents of which is incorporated herein by reference in its entirety.

FIELD

The present disclosure relates to a stiffening device for stiffening fans arranged in parallel having a particularly rod-shaped and/or support-shaped and/or strut-shaped base body.

BACKGROUND

When operating multiple fans in parallel, for example in an air handling unit (AHU), resonant frequencies of the mechanical structure can lie within the speed range of the fans, depending on the mechanical design. The manner in which the fan is suspended, for example by means of a spider-type mount, results in an easily excited oscillating structure which, together with the mechanical support structure, leads to resonant frequencies. These resonant frequencies are excited by the imbalance of one or more fans and can lead to unacceptably high vibration loads for the individual fan. This results in premature failure of the fan.

Furthermore, an air conditioning unit is typically designed specifically for the application. Consequently, the dimensions and thus also the resonant frequencies that occur differ greatly.

BRIEF SUMMARY

The present disclosure provides a stiffening device for stiffening fans arranged in parallel which can be adapted to an individual distance between fans and can be retrofitted easily and without complex tools.

In the present disclosure the resonant frequency of the fans arranged in parallel is shifted into higher speed ranges with the aim of shifting the resonant frequency outside the predetermined speed range of the fans. This is achieved by means of a stiffening device, preferably arranged in a plane at the level of the motor suspension of the fan on the preferably spider-shaped receiving structure of the fan, which stiffening device is preferably strut-like and can be used universally by means of a simple fastening mechanism, in particular a clamping and/or a locking mechanism, as well as a length adjustment by means of a tolerance compensation means. The stiffening device is arranged in the manner of a strut between the two fans.

According to the present disclosure, a stiffening device for stiffening fans arranged in parallel having a particularly rod-shaped and/or support-shaped and/or strut-shaped base body is therefore proposed. Furthermore, a first fastening element for fastening to a receiving structure, in particular a holder, a housing, a support, a frame, and/or a receiving bracket, preferably for a fan motor, of one of the fans is formed on or as part of the base body. In addition, a second fastening element is formed on or as part of the base body for fastening to a receiving structure, in particular a holder, a housing, a support, a frame, and/or a receiving bracket, preferably for a fan motor, of another fan arranged immediately adjacent. Furthermore, the base body has a tolerance compensation means for continuously adjusting a longitudinal extent of the stiffening device such that, in an assembled state, a stiffness of the fans connected by the stiffening device can be increased.

In an advantageous embodiment, a provision is made that the first fastening element is formed on a first longitudinal end of the base body and/or the second fastening element is formed on a second longitudinal end of the base body.

Preferably, the stiffening device is designed such that the tolerance compensation means is a threaded spindle or a particularly fixable telescopic mechanism or a particularly fixable rail system.

In one exemplary embodiment of the present disclosure, a provision is made that the base body is divided into a first base body part and a second base body part. The first base body part and/or the second base body part has a thread at least in one connection area and/or has the shape of a bolt thread or screw. Furthermore, the tolerance compensation means is a screw nut, in particular a long nut, and/or a sleeve with an internal thread, which connects the first base body part and the second base body part to one another.

Furthermore, an embodiment is favorable in which the first fastening element and/or the second fastening element is a locking means, in particular a locking hook or a clip or a clamp or a bracket.

According to the present disclosure, a system with at least two fans arranged in parallel is further proposed in which a stiffening device according to the preceding disclosure is provided at least between two of the fans arranged in parallel such that a stiffness of the fans connected by the corresponding stiffening device is increased.

In an advantageous exemplary embodiment, a provision is made that a plurality of fans arranged in parallel is provided and at least one stiffening device according to the above disclosure is arranged between adjacent fans.

In another advantageous variant, the present disclosure makes a provision that the stiffening devices are arranged parallel to one another in the longitudinal direction of the fans, preferably parallel to the longitudinal direction of the fans, and/or offset from one another.

In an alternative exemplary embodiment, the present disclosure makes a provision that the stiffening devices are arranged in the longitudinal direction of the fans alternately with a positive pitch and a negative pitch on adjacent fans.

The system according to the present disclosure is designed in one embodiment such that, at least on one fan, which is arranged in a row of parallel fans at one end of the row, a stiffening device according to the above disclosure is arranged which is fastened with the second fastening element to a wall and/or a support and/or a mounting surface of the fans.

The features disclosed above can be combined as required, provided this is technically possible and they do not contradict one another.

BRIEF DESCRIPTION OF THE DRAWINGS

Other advantageous refinements of the present disclosure are characterized in the subclaims and/or depicted in greater detail below together with the description of the preferred embodiment of the present disclosure with reference to the figures. Brief description of the drawings:

The figures are schematic examples. Same reference symbols in the figures indicate same functional and/or structural features.

DETAILED DESCRIPTION

Figure 1:
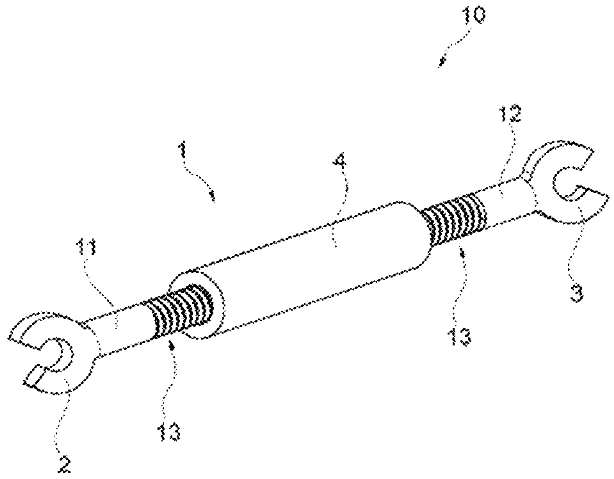
FIG. 1 shows a perspective view of a stiffening device.

FIG. 1 shows a perspective view of a stiffening device 10 for stiffening fans 100 arranged in parallel with a rod-shaped base body 1.

A first fastening element 2 for fastening to a receiving structure 15 of one of the fans 100 is formed on the base body 1. Furthermore, a second fastening element 3 is formed on the base body 1 for fastening to a receiving structure 15 of another fan 100 arranged immediately adjacent. The first fastening element 2 and the second fastening element 3 are each a locking means, in particular a locking hook. Furthermore, the first fastening element 2 is formed on a first longitudinal end of the base body 1 and the second fastening element 3 is formed on a second longitudinal end of the base body 1.

In addition, the base body 1 has base and/or a tolerance compensation means 4 for continuously adjusting a longitudinal extent of the stiffening device 10 such that, in an assembled state, a stiffness of the fans 100 connected by the stiffening device 10 can be increased.

In addition, the base body 1 is divided into a first base body part 11 and a second base body part 12. The first base body part 11 and the second base body part 12 have a thread 13 at least in a connecting area and/or have the shape of a bolt thread or screw. The tolerance compensation means 4 is a screw nut, in particular a long nut, which connects the first base body part 11 and the second base body part 12 to one another.

Figure 2:
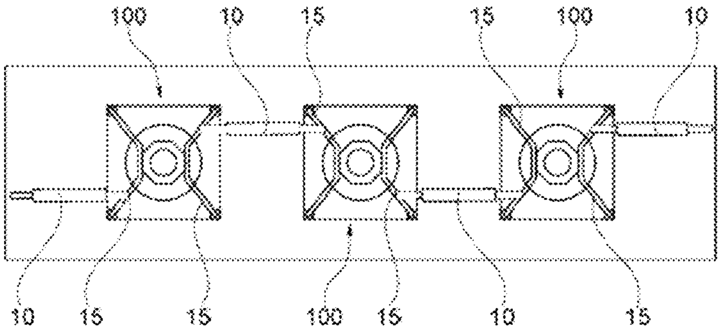
FIG. 2 shows a schematic view of a system.

FIG. 2 shows a schematic view of a system with three fans 100 arranged in parallel in which a stiffening device 10 according to the preceding disclosure is provided between adjacent fans 10 of the fans 100 arranged in parallel such that a stiffness of the fans 100 connected by the corresponding stiffening device 10 is increased.

The stiffening devices 10 are arranged in the longitudinal direction of the fans 100 parallel to the longitudinal direction of the fans 100 and offset from one another.

Furthermore, a stiffening device 10 according to the preceding disclosure is arranged on both fans 100, which are arranged in a row of the parallel fans 100 at one end of the row, which stiffening device 10 is fastened by the second fastening element 3 to a wall and/or a support and/or a mounting surface of the fans 100.

Figure 3:
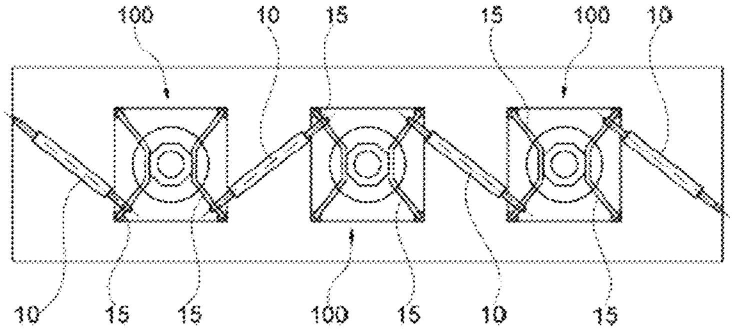
FIG. 3 shows a schematic view of another system.

FIG. 3 shows a schematic view of another system with three fans 100 arranged in parallel in which a stiffening device 10 according to the preceding disclosure is provided between adjacent fans 10 of the fans 100 arranged in parallel such that a stiffness of the fans 100 connected by the corresponding stiffening device 10 is increased. Since the other system shown in FIG. 3 has substantially the features of the system shown in FIG. 2, only features that differ will be discussed below.

According to FIG. 3, the stiffening devices 10 are arranged in the longitudinal direction of the fans 100 alternately with a positive pitch and a negative pitch on adjacent fans 100.

The present disclosure is not limited in its execution to the abovementioned preferred exemplary embodiments. Rather, a number of variants are conceivable which make use of the illustrated solution even in the form of fundamentally different embodiments.

The invention claimed is:

1. A system with at least two fans arranged in parallel, the system comprising:

at least one stiffening device having a base body, wherein a first fastener is formed on the base body and is selectively fastened to a receiving structure of a first fan of the at least two fans, wherein a second fastener is formed on the base body and selectively fastened to a receiving structure of a second fan of the at least two fans, the second fan located adjacent to the first fan, wherein the base body has a tolerance compensation means for continuously adjusting a longitudinal extent of the stiffening device such that, in an assembled state, a stiffness of the first and second fans connected by the stiffening device can be increased.

2. The system according to claim 1, wherein the first fastener is formed on a first longitudinal end of the base body and the second fastener is formed on a second longitudinal end of the base body.

3. The system according to claim 1, wherein the tolerance compensation means is a threaded spindle.

4. The system according to claim 1, wherein the base body is divided into a first base body part and a second base body part, wherein the first base body part and/or the second base body part has a thread at least in a connecting region and/or has the shape of a bolt thread or screw, wherein the tolerance compensation means is a screw nut and/or a sleeve with an internal thread which connects the first base body part and the second base body part to one another.

5. The system according to claim 1, wherein the first fastener and/or the second fastener is a locking hook or a clip or a clamp or a bracket.

6. The system according to claim 1, wherein the at least two fans includes more than two fans arranged in parallel, wherein the least one stiffening device is arranged between adjacent fans.

7. The system according to claim 1, wherein a plurality of the at least one stiffening device are arranged parallel to one another in the longitudinal direction of the at least two fans, and parallel to a longitudinal direction of the at least two fans and/or offset from one another.

8. The system according to claim 1, wherein a plurality of the at least one stiffening device are arranged in a longitudinal direction of the at least two fans alternately with a positive pitch and a negative pitch on adjacent fans.

9. The system according to claim 1, wherein the first and second fans are arranged in a row, and wherein at least on one of the first and second fans at one end of the row, the at least one stiffening device is arranged and fastened with the second fastener to a wall and/or a support and/or a mounting surface of the at least two fans.

10. A system with at least a first fan and a second fan arranged in parallel, the system comprising:

a stiffening device having a base body, a first fastener, and a second fastener;

wherein the base body has a base;

wherein the first fastener is formed as part of the base body, the first fastener configured for fastening to a receiving structure of the first fan;

wherein the second fastener is formed as part of the base body, the second fastener configured for fastening to a receiving structure of the second fan arranged immediately adjacent the first fan; and wherein the first and second fasteners are moveably connected to the base such that the base body is configured for adjustment of the first fastener relative to the second fastener for continuously adjusting a longitudinal extent of the stiffening device such that, in an assembled state, a stiffness of the fans connected by the stiffening device can be increased.

* * * * *